United States Patent
Hayashi et al.

(10) Patent No.: US 8,330,166 B2
(45) Date of Patent: Dec. 11, 2012

(54) THIN-FILM SEMICONDUCTOR DEVICE FOR DISPLAY APPARATUS THEREOF AND MANUFACTURING METHOD THEREOF

(75) Inventors: Hiroshi Hayashi, Osaka (JP); Takahiro Kawashima, Osaka (JP); Genshiro Kawachi, Chiba (JP)

(73) Assignees: Panasonic Corporation, Osaka (JP); Panasonic Liquid Crystal Display Co., Ltd., Hyogo (JP)

( * ) Notice: Subject to any disclaimer, the term of this patent is extended or adjusted under 35 U.S.C. 154(b) by 0 days.

(21) Appl. No.: 13/115,409

(22) Filed: May 25, 2011

(65) Prior Publication Data

US 2011/0278583 A1    Nov. 17, 2011

Related U.S. Application Data

(63) Continuation of application No. PCT/JP2010/003186, filed on May 11, 2010.

(51) Int. Cl.
*H01L 27/14* (2006.01)
*H01L 29/04* (2006.01)
*H01L 29/10* (2006.01)
*H01L 21/00* (2006.01)

(52) U.S. Cl. ............ 257/72; 257/59; 257/66; 438/149
(58) Field of Classification Search ............... None
See application file for complete search history.

(56) References Cited

U.S. PATENT DOCUMENTS

| | | | |
|---|---|---|---|
| 6,794,682 B2 | 9/2004 | Watanabe et al. | |
| 7,514,762 B2* | 4/2009 | Deane | 257/538 |
| 7,968,885 B2 | 6/2011 | Kobayashi et al. | |
| 2005/0067618 A1* | 3/2005 | Nakajima et al. | 257/59 |

(Continued)

FOREIGN PATENT DOCUMENTS

| | | |
|---|---|---|
| JP | 05-063196 | 3/1993 |
| JP | 06-326314 | 11/1994 |
| JP | 2009-060096 | 3/2009 |

OTHER PUBLICATIONS

Dongjo Kim et al., Thin Film Transistors with Ink-Jet Printed Amorphous Oxide Semiconductors, May 20, 2010, pp. 1-4.*
International Search Report and Written Opinion in corresponding PCT/JP2010/003186, dated Jul. 20, 2010.
Hatzopoulos et al., "Stability of Amorphous-Silicon and Nanocrystalline Silicon Thin-Film Transistors Under DC and AC Stress", IEEE Electron Device Letters, vol. 28, Issue 9, pp. 803-805 (Sep. 2007).

*Primary Examiner* — Charles Garber
*Assistant Examiner* — Harpreet Singh
(74) *Attorney, Agent, or Firm* — Greenblum & Bernstein, P.L.C.

(57) ABSTRACT

A thin-film semiconductor device includes, in order, a substrate, a gate electrode, a gate insulating film, a first channel layer, and a second channel layer. The second channel layer includes a protrusion between first top surface end portions. The protrusion has first lateral surfaces that each extend between one of the first top surface end portions and a top surface of the protrusion. An insulation layer is on the top surface of the protrusion. The insulation layer has second lateral surfaces that each extend to one of second top surface end portions of the insulation layer. Two contact layers are each on one of the second top surface end portions of the insulation layer, adjacent one of the second lateral surfaces of the insulation layer, adjacent one of the first lateral surfaces of the protrusion, and on one of the first top surface end portions of the second channel layer. A source electrode is on one of the two contact layers, and a drain electrode is on the other of the two contact layers. The two contact layers and the upper portion of the protrusion of said second channel layer are of opposite conductivity types.

10 Claims, 13 Drawing Sheets

U.S. PATENT DOCUMENTS

2009/0039351 A1    2/2009  Kobayashi et al.
2010/0032680 A1*  2/2010  Kaitoh et al. .................. 257/72
2010/0194719 A1    8/2010  Saitoh et al.
2010/0320467 A1  12/2010  Ukeda et al.
2011/0175091 A1   7/2011  Kobayashi et al.
2011/0299005 A1* 12/2011  Takeguchi et al. ............. 349/46

* cited by examiner

THIN-FILM SEMICONDUCTOR DEVICE FOR DISPLAY APPARATUS THEREOF AND MANUFACTURING METHOD THEREOF

CROSS REFERENCE TO RELATED APPLICATION

This is a continuation application of PCT application No. PCT/JP10/003186 filed on May 11, 2010, designating the United States of America, the disclosure of which, including the specification, drawings and claims, is incorporated herein by reference in its entirety.

BACKGROUND OF THE INVENTION

1. Field of the Invention

The present invention relates to thin-film semiconductor devices for driving active-matrix liquid crystal displays and organic electroluminescence (EL) displays, and in particular to a structure and a manufacturing method of a thin-film semiconductor device for display apparatus which device has a dual-channel-layer structure in which a polycrystalline semiconductor channel layer and a non-crystalline semiconductor channel layer are provided.

2. Description of the Related Art

In recent years, as one of the next-generation flat panel displays replacing liquid crystal displays, attentions have been focused on an organic electroluminescence (EL) display using electroluminescence of an organic material. Organic EL displays are current drive devices different from liquid crystal displays that are of a voltage drive type. There is therefore a pressing necessity to develop a thin-film semiconductor device having excellent on-off characteristics as a drive circuit for active-matrix display apparatuses.

As a thin-film semiconductor device in a drive circuit for liquid crystal displays, there is conventionally a thin-film semiconductor device in which a channel layer is a single layer made of a non-crystalline semiconductor. The thin-film semiconductor device of this type has a wide band gap and therefore flows a small amount of off-state current, but involves a problem of on-state current being also small due to low mobility.

There is also a thin-film semiconductor device in which a channel layer is a single layer made of a polycrystalline semiconductor, as a thin-film semiconductor device in a drive circuit for a liquid crystal display. The thin-film semiconductor device of this type has high mobility, thus flowing a large amount of on-state current, but involves a problem of off-state current being also high due to the presence of grain boundaries and defects in the polycrystalline semiconductor, in contrast to the thin-film semiconductor device in which a channel layer is a single layer made of a non-crystalline semiconductor.

To solve these problems, a thin-film semiconductor device has been proposed which has a dual-channel-layer structure in which a polycrystalline semiconductor channel layer and a non-crystalline semiconductor channel layer are provided (refer to Hatzopoulos et al., IEEE ELECTRON DEVICE LETTERS 28, 803 (2007), for example). It is said that providing the channel layer with the dual-layer structure having a polycrystalline semiconductor channel layer and a non-crystalline semiconductor channel layer enables interaction of advantages of the respective layers, thereby ideally resulting in such characteristics that the on-state current is higher than that in the case of a non-crystalline semiconductor single-channel layer and the off-state current is lower than that in the case of a polycrystalline semiconductor single-channel layer.

However, in an actual thin-film semiconductor device, providing the channel layer with the dual-layer structure having a polycrystalline semiconductor channel layer and a non-crystalline semiconductor channel layer causes interaction of defects of the respective layers, therefore not necessarily being capable of increasing the on-state current and decreasing the off-state current. That is, in a front channel which, as a pathway for charges, runs through both of the non-crystalline semiconductor channel layer and the polycrystalline semiconductor channel layer between source and drain electrodes, the charges move across the non-crystalline semiconductor channel layer having high resistance, which causes a problem of decreasing on-state current. Furthermore, when, as a pathway through which charges move, not only a front channel running through both of the non-crystalline semiconductor channel layer and the polycrystalline semiconductor channel layer, but also a back channel running through only the non-crystalline semiconductor channel layer, are present between the source and drain electrodes, the non-crystalline semiconductor channel layer acts as a parasitic current pathway, which increases off-state current as leak current.

As a disclosed technique of increasing on-state current in order to deal with these problems, there is a disclosure of a thin-film semiconductor device including a channel layer having a protruding shape (refer to U.S. Pat. No. 6,794,682, for example). According to this disclosed technique, when, in a part below the protruding shape of the channel layer which part serves as a current pathway, current flows between source and drain electrodes through the parts of the channel layer below both sides of the protruding shape, a resistance component in a vertical direction of the channel layer can be smaller because the parts of the channel layer below the both sides of the protruding shape of the channel layer are thinner than a part of the protruding shape of the channel layer. This makes it possible to keep the resistance across the part below the protruding shape of the channel layer low and to thereby increase on-state current. The upper part of the protruding shape of the channel layer acts as a resistance between the source electrode and the drain electrode. Charge movement is therefore suppressed in the back channel between the source electrode and the drain electrode.

On the other hand, as a disclosed technique of decreasing off-state current, there is a technique that, in a thin-film semiconductor device having a dual-layer structure in which a polycrystalline semiconductor channel layer and a non-crystalline semiconductor channel layer are provided, the non-crystalline semiconductor channel layer has a recess formed by over-etching, and inside the recess, a region of a conductivity type opposite to a conductivity type of a contact layer is formed (refer to Japanese Unexamined Patent Application Publication No. 2009-060096, for example). This disclosed technique has an advantage of suppressed charge movement in the recess formed in the non-crystalline channel layer because the recess is of the conductivity type opposite to the contact layer.

SUMMARY OF THE INVENTION

However, in the technique disclosed by U.S. Pat. No. 6,794,682, the charge movement is suppressed merely using the part of the protruding shape of the channel layer as resistance, with the result that the charge movement in the back channel between the source electrode and the drain electrode is suppressed merely in the range that the resistance can suppress charge movement. Thus, the above related art, even though reduces off-state current, has a problem that the off-state current does not significantly decrease beyond the limit imposed by the resistance.

Furthermore, in the technique disclosed by Japanese Unexamined Patent Application Publication No. 2009-060096, charges move in the polycrystalline semiconductor channel layer through thick side parts of the recess formed in the non-crystalline semiconductor channel layer between the source electrode and the drain electrode. There is therefore a problem of high resistance across an upper region of the thick side parts of the recess formed in the non-crystalline semiconductor channel layer. This leads to a problem of a decrease in on-state current and deteriorating characteristics even in the case where the channel layer has a dual-layer structure in which a polycrystalline semiconductor channel layer and a non-crystalline semiconductor channel layer are provided. What is worse, because this disclosed technique forms the recess by over-etching the center of the non-crystalline semiconductor channel layer, considering the thickness of the layer reduced by over-etching, there is a limitation in reducing the thickness of the non-crystalline semiconductor channel layer and therefore, there is also a limitation in reducing the thickness of the side part of the recess.

Thus, the two techniques disclosed by U.S. Pat. No. 6,794, 682 and Japanese Unexamined Patent Application Publication No. 2009-060096 have an effect of increasing on-state current and an effect of decreasing off-state current, respectively, but fail to give sufficient consideration to providing combination of the effect of increasing on-state current and the effect of decreasing off-state current, and there is a problem that advantages of these effects are unable to be sufficiently derived from the thin-film semiconductor device having the dual-layer structure in which the polycrystalline semiconductor channel layer and the non-crystalline semiconductor channel layer are provided.

The present invention has been devised in view of the above problems and an object of the present invention is to provide a thin-film semiconductor device for display apparatus and a manufacturing method thereof, which device has a dual-layer structure in which a polycrystalline semiconductor channel layer and a non-crystalline semiconductor channel layer are provided and is capable of significantly decreasing off-state current beyond a limit of a layer acting as resistance and significantly increasing on-state current without reducing the thickness of the whole non-crystalline semiconductor channel layer.

In order to achieve the above object, a thin-film semiconductor device for display apparatus according to an aspect of the present invention includes: a substrate; a gate electrode formed on the substrate; a gate insulating film formed on the gate electrode; a first channel layer including a polycrystalline semiconductor layer formed on the gate insulating film; a second channel layer having a protruding shape in a surface and including a non-crystalline semiconductor layer formed on the first channel layer; an insulation layer formed on a top surface of the protruding shape of the second channel layer; two contact layers formed on top and lateral surfaces of ends of the insulation layer, lateral surfaces of the protruding shape of the second channel layer which continue from the lateral surfaces of the insulation layer, and a top surface of the second channel layer which continues from the lateral surfaces of the protruding shape of the second channel layer; a source electrode formed on one of the contact layers; and a drain electrode formed on the other of the contact layers, wherein the two contact layers are of a first conductivity type, and an upper part of the protruding shape of the second channel layer is of a second conductivity type opposite to the first conductivity type.

The thin-film semiconductor device for display apparatus according to an aspect of the present invention provides an advantageous effect of achieving a thin-film semiconductor device for display apparatus and a manufacturing method thereof, which device is capable of significantly increasing on-state current and significantly decreasing off-state current.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

Figure 1:
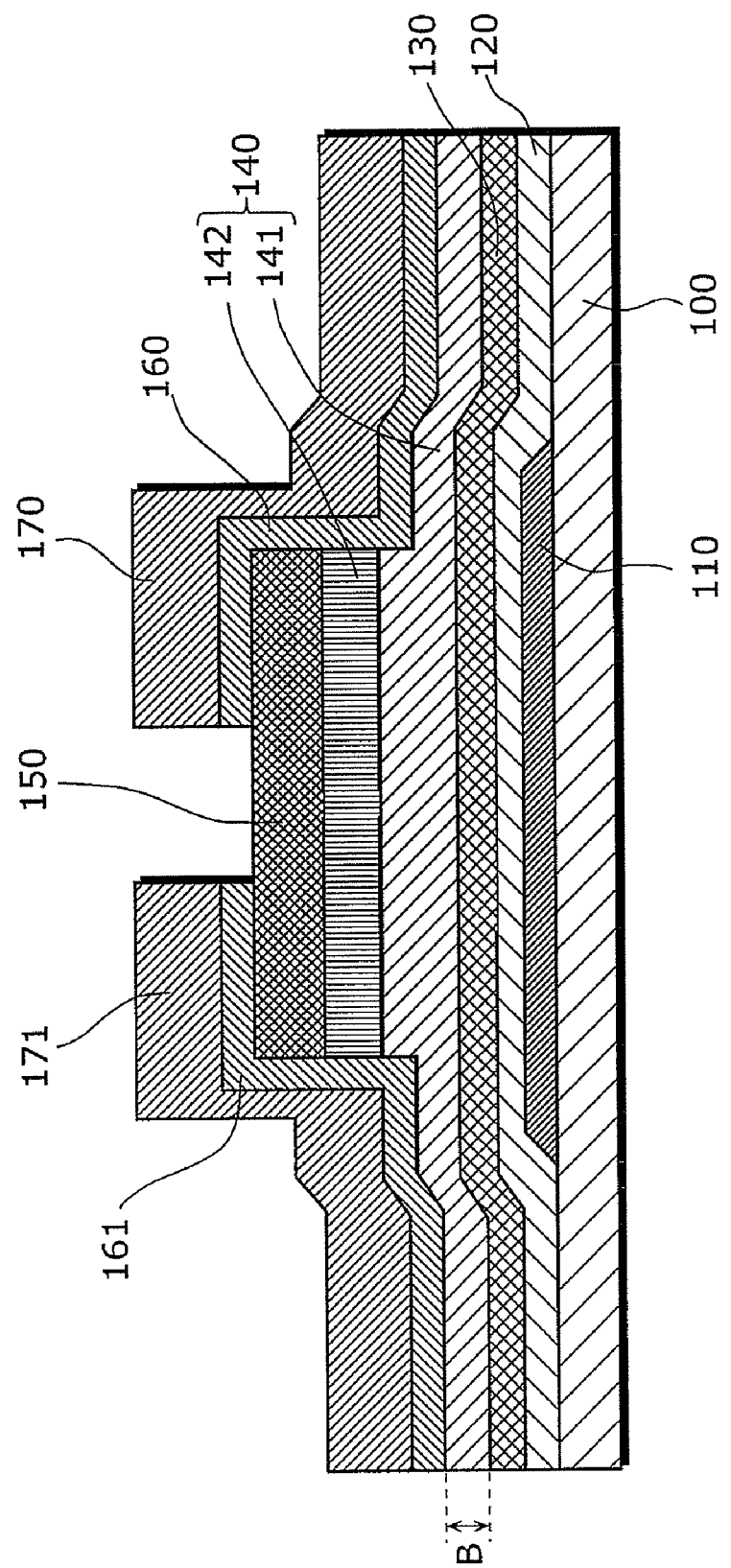
FIG. 1 is a cross-section diagram schematically showing a structure of a thin-film semiconductor device for display apparatus according to an embodiment of the present invention.

A thin-film semiconductor device for display apparatus according to an aspect of the present invention includes: a substrate; a gate electrode formed on the substrate; a gate insulating film formed on the gate electrode; a first channel layer including a polycrystalline semiconductor layer formed on the gate insulating film; a second channel layer having a protruding shape in a surface and including a non-crystalline semiconductor layer formed on the first channel layer; an insulation layer formed on a top surface of the protruding shape of the second channel layer; two contact layers formed on top and lateral surfaces of ends of the insulation layer, lateral surfaces of the protruding shape of the second channel layer which continue from the lateral surfaces of the insulation layer, and a top surface of the second channel layer which continues from the lateral surfaces of the protruding shape of the second channel layer; a source electrode formed on one of the contact layers; and a drain electrode formed on the other of the contact layers, wherein the two contact layers are of a first conductivity type, and an upper part of the protruding shape of the second channel layer is of a second conductivity type opposite to the first conductivity type.

According to this aspect, the thickness of the second channel layer on the both sides of the protruding shape can be reduced than the thickness of the protruding shape, so that the thickness of the second channel layer between the first channel layer and the one of the source electrode and the drain electrode can be reduced. This makes it possible to keep the resistance across the current pathway (front channel) from the source electrode and the drain electrode through the first channel layer low. As a result, in the case where the channel layer has the dual-layer structure in which the polycrystalline semiconductor channel layer and the non-crystalline semiconductor channel layer are provided, it is possible to significantly increase the on-state current without reducing the thickness of the whole non-crystalline semiconductor channel layer.

Furthermore, the insulation layer contains fixed charges, and the second channel layer contacts this insulation layer. When the voltage applied to the second channel layer by the fixed charges exceeds a threshold voltage for formation of a back channel in the interface between the insulation layer and the second channel, back channel conduction occurs and off-state current increases as leak current. However, a surface of the second channel layer made up of the non-crystalline semiconductor layer is formed into a protruding shape, and the contact layer is of the first conductivity type while the upper part of the protruding shape of the second channel layer is of the second conductivity type. The threshold voltage for formation of a back channel is therefore high in the upper part of the protruding shape of the second channel layer, with the result that the charge movement is significantly suppressed in the back channel through the upper part of the protruding shape of the second channel layer between the source electrode and the drain electrode. As a result, it is possible to significantly decrease off-state current beyond the limit on which the charge movement is suppressed by resistance, as compared to the case where the protruding shape of the second channel layer is structured as a mere resistor.

In the thin-film semiconductor device for display apparatus according to an aspect of the present invention, parts of the second channel layer below both sides of the protruding shape may serve as a pathway through which charges move between the first channel layer and one of the source electrode and the drain electrode.

Furthermore, in the thin-film semiconductor device for display apparatus according to an aspect of the present invention, the insulation layer may have a same width as the top surface of the upper part of the protruding shape of the second channel layer.

Furthermore, in the thin-film semiconductor device for display apparatus according to an aspect of the present invention, the upper part of the protruding shape of the second channel layer may be doped with impurities which impart the second conductivity type opposite to the first conductivity type.

Furthermore, in the thin-film semiconductor device for display apparatus according to an aspect of the present invention, it may be possible that the first conductivity type is P type, and the second conductivity type is N type.

Furthermore, in the thin-film semiconductor device for display apparatus according to an aspect of the present invention, it may be possible that the first conductivity type is N type, and the second conductivity type is P type.

Furthermore, in the thin-film semiconductor device for display apparatus according to an aspect of the present invention, the insulation layer may include phosphorus silicate glass (PSG).

Furthermore, in the thin-film semiconductor device for display apparatus according to an aspect of the present invention, the insulation layer may include boron silicate glass (BSG).

Furthermore, in the thin-film semiconductor device for display apparatus according to an aspect of the present invention, it may be possible that the polycrystalline semiconductor layer is made of polycrystalline silicon, and the non-crystalline semiconductor layer is made of non-crystalline silicon.

Furthermore, in the thin-film semiconductor device for display apparatus according to an aspect of the present invention, the polycrystalline semiconductor layer may include a microcrystalline semiconductor layer having an average particle diameter between 20 nm and 50 nm inclusive.

Furthermore, a manufacturing method of a thin-film semiconductor device for display apparatus according to an aspect of the present invention includes: preparing a substrate; forming a gate electrode on the substrate; forming a gate insulating film on the gate electrode; forming a first channel layer including a polycrystalline semiconductor layer on the gate insulating film; forming a second channel layer including a non-crystalline semiconductor layer on the first channel layer; doping an upper layer of the second channel layer with impurities so as to impart a second conductivity type to the upper layer of the second channel layer; forming an insulation layer on the second channel layer; placing a resist having a predetermined width on the insulation layer; etching the insulation layer and the upper layer of the second channel layer doped with the impurities, using the resist as a mask in a predetermined dry etching process, to form a protruding shape in a surface of the second channel layer; removing the resist from the insulation layer; forming two contact layers on top and lateral surfaces of ends of the insulation layer, lateral surfaces of the protruding shape of the second channel layer which continue from the lateral surfaces of the insulation layer, and a top surface of the second channel layer which continues from the lateral surfaces of the protruding shape of the second channel layer, the two contact layers being of a first conductivity type opposite to the second conductivity type; and forming a source electrode on one of the contact layers and forming a drain electrode on the other of the contact layers.

Furthermore, a manufacturing method of a thin-film semiconductor device for display apparatus according to an aspect of the present invention includes: preparing a substrate; forming a gate electrode on the substrate; forming a gate insulating film on the gate electrode; forming a first channel layer including a polycrystalline semiconductor layer on the gate insulating film; forming a non-crystalline semiconductor layer on the first channel layer; forming, on the non-crystalline semiconductor layer, a layer which includes impurities so as to be of a second conductivity type, to form a second channel layer made up of the non-crystalline semiconductor layer and the layer which includes the impurities so as to be of the second conductivity type; forming an insulation layer on the second channel layer; placing a resist having a predetermined width on the insulation layer; etching the insulation layer and the layer of the second channel layer which includes the impurities, using the resist as a mask in a predetermined dry etching process, to form a protruding shape in a surface of the second channel layer; removing the resist from the insulation layer; forming two contact layers of a first conductivity type opposite to the second conductivity type, on top and lateral surfaces of ends of the insulation layer, lateral surfaces of the protruding shape of the second channel layer which continue from the lateral surfaces of the insulation layer, and a top surface of the second channel layer which continues from the lateral surfaces of the protruding shape of the second channel layer; and forming a source electrode on one of the contact layers and forming a drain electrode on the other of the contact layers.

Furthermore, a manufacturing method of a thin-film semiconductor device for display apparatus according to an aspect of the present invention includes: preparing a substrate; forming a gate electrode on the substrate; forming a gate insulating film on the gate electrode; forming a first channel layer including a polycrystalline semiconductor layer on the gate insulating film; forming a second channel layer including a non-crystalline semiconductor layer on the first channel layer; forming, on the second channel layer, an insulation layer containing impurities which impart a second conductivity type to the second channel layer; placing a resist having a predetermined width on the insulation layer; etching the insulation layer and an upper layer of the second channel layer, using the resist as a mask in a predetermined dry etching process, to form a protruding shape in a surface of the second channel layer; removing the resist from the insulation layer; forming two contact layers of a first conductivity type opposite to the second conductivity type, on top and lateral surfaces of ends of the insulation layer, lateral surfaces of the protruding shape of the second channel layer which continue from the lateral surfaces of the insulation layer, and a top surface of the second channel layer which continues from the lateral surfaces of the protruding shape of the second channel layer; and forming a source electrode on one of the contact layers and forming a drain electrode on the other of the contact layers, wherein any one of the forming of an insulation layer, the placing of a resist, the etching, the removing of the resist, and the forming of two contact layers includes heating the insulation layer so that the impurities with which the insulation layer is doped is diffused in the upper layer of the second channel layer.

According to these aspects, it is possible to provide a manufacturing method of a thin-film semiconductor device for display apparatus which device is capable of significantly increasing the on-state current without reducing the thickness of the whole non-crystalline semiconductor channel layer, in the case where the channel layer has the dual-layer structure in which the polycrystalline semiconductor channel layer and the non-crystalline semiconductor channel layer are provided. Furthermore, it is possible to provide a manufacturing method of a thin-film semiconductor device for display apparatus which device is capable of significantly decreasing the off-state current beyond the limit on which the charge movement is suppressed by resistance, as compared to the case where the protruding shape of the second channel layer is structured as a mere resistor.

In the manufacturing method of a thin-film semiconductor device for display apparatus according to an aspect of the present invention, it may be possible that the first conductivity type is P type, and the second conductivity type is N type.

In the manufacturing method of a thin-film semiconductor device for display apparatus according to an aspect of the present invention, it may be possible that the first conductivity type is N type, and the second conductivity type is P type.

In the manufacturing method of a thin-film semiconductor device for display apparatus according to an aspect of the present invention, it may be possible that the first conductivity type is P type, the second conductivity type is N type, and the insulation layer includes phosphorus silicate glass (PSG).

In the manufacturing method of a thin-film semiconductor device for display apparatus according to an aspect of the present invention, it may be possible that the first conductivity type is N type, the second conductivity type is P type, and the insulation layer includes boron silicate glass (BSG).

With reference to the drawings, the following describes a thin-film semiconductor device for display apparatus and a manufacturing method thereof in embodiments of the present invention.

FIG. 1 is a cross-section diagram schematically showing a structure of the thin-film semiconductor device for display apparatus according to an embodiment of the present invention.

This thin-film semiconductor device for display apparatus is a bottom gate thin-film transistor device which includes a substrate 100, and a gate electrode 110, a gate insulating film 120, a first channel layer 130, a second channel layer 140, an insulation layer 150, a pair of contact layers 160 and 161, and one of a source electrode 170 and a drain electrode 171 which are stacked sequentially on the substrate 100.

The substrate 100 is made of quartz glass, for example.

The gate electrode 110 is made of a metal such as molybdenum tungsten (MoW) and formed on the substrate 100.

The gate insulating film 120 is made of silicon oxide ($SiO_x$), silicon nitride ($SiN_y$), or a lamination thereof, for example, and formed on the substrate 100 and the gate electrode 110 so as to cover the gate electrode 110.

The first channel layer 130 is a polycrystalline semiconductor layer made of, for example, polycrystalline silicon, formed on the gate insulating film 120, and increases on-state current. It is to be noted that the polycrystalline semiconductor layer may include a microcrystalline semiconductor layer having an average particle diameter between 20 nm and 50 nm inclusive. Alternatively, the polycrystalline semiconductor layer may be a microcrystalline semiconductor layer having an average particle diameter between 20 nm and 50 nm inclusive.

The second channel layer 140 is a non-crystalline semiconductor layer such as a non-crystalline silicon layer formed on the first channel layer 130, and has higher band gap energy (Eg) than the first channel layer 130, thus causing a decrease in off-state current. For example, the second channel layer 140 has Eg of 1.8 eV, and the first channel layer 130 has Eg of 1.1 eV.

The second channel layer 140 includes a surface having a protruding shape (protruding part) and a flat shape (flat part), and is thus composed of a first layer 141 that is made up of a lower part of the protruding part and the flat part other than the protruding part, and a second layer 142 that is made up of an upper part of the protruding part and is of the second conductivity type (opposite to the first conductivity type). The second layer 142 suppresses the charge movement in a back channel while a reduction in thickness of the first layer 141 lowers the resistance across the source and the drain and thereby causes an increase in an amount of current flowing in a linear region.

The protruding part of the second channel layer 140 indicates that convex part of the second channel layer is in a trapezoidal form as shown in FIG. 1, for example.

The parts of the second channel layer 140 below both sides of the protruding part, that is, the first layer 141 of the flat parts on both sides of the protruding part of the second channel layer 140, serve as a pathway through which charges move between the first channel layer 130 and the one of the source electrode 170 and the drain electrode 171. In the second channel layer 140, the flat part has a smaller thickness than that of the protruding part (the height of the protruding part).

The second conductivity type of the second layer 142 is formed by doping the second channel layer 140 with impurities which impart the second conductivity type opposite to the first conductivity type.

Furthermore, the protruding part of the second channel layer 140 is located above the gate electrode 11 and has its both ends more internally than the both ends of the gate electrode 11.

Moreover, in part of the protruding part of the second channel layer 140 in contact with the contact layers 160 and 161 and the insulation layer 150, the second layer 142 is continuously formed across the protruding part of the second channel layer 140 in a direction in which the source electrode 170 and the drain electrode 171 are arranged. In other words, the second layer 142 is formed over the entire top surface of the protruding part of the second channel layer 140.

The insulation layer 150 is made of silicon oxide ($SiO_x$) or silicon nitride ($SiN_y$), for example, and formed only on the top surface of the protruding shape (the second layer 142) of the second channel layer 140. With this, in etching for formation of the contact layers 160 and 161, the insulation layer 150 can function as a channel etching stopper (CES) layer for protecting the second channel layer 140 from etching.

The insulation layer 150 has the same width as the top surface of the upper part (the second layer 142) of the protruding part of the second channel layer 140 and has lateral surfaces in the same plane as respective lateral sides of the protruding part (the second layer 142) of the second channel layer 140. The width of the insulation layer 150 and the width of the protruding part of the second channel layer 140 indicate widths thereof in the direction in which the source electrode 170 and the drain electrode 171 are arranged, that is, in the flow direction of channel charges.

In the case where the first conductivity type is P type and the second conductivity type is N type, the insulation layer 150 may be made of phosphorus silicate glass (PSG). On the other hand, in the case where the first conductivity type is N type and the second conductivity type is P type, the insulation layer 150 may be made of boron silicate glass (BSG).

The pair of the contact layers 160 and 161 are made of, for example, non-crystalline silicon which is of the first conductivity type and has a higher impurity concentration than the second channel layer 140 (the second layer 142), and provided on the second channel layer 140 and the insulation layer 150 so that the contact layers 160 and 161 are spaced from each other. Specifically, the two contact layers 160 and 161 are provided separately on the both sides of the protruding part of the second channel layer 140, and formed on the top and lateral surfaces of the ends of the insulation layer 150, the lateral surfaces of the protruding part of the second channel layer 140 which continue from the lateral surfaces of the insulation layer 150, and the top surface (the top surface of the flat part) of the second channel layer 140 which continues from the lateral surfaces of the protruding part of the second channel layer 140.

The pair of the source electrode 170 and the drain electrode 171 are spaced from each other. Specifically, the source electrode 170 is formed on the contact layer 160 that is one of the pair of the contact layers 160 and 161, and the drain electrode 171 is formed on the contact layer 161 that is the other of the pair of the contact layers 160 and 161. The source electrode 170 and the drain electrode 171 each have a monolayer or multilayer structure made of a conductive material, an alloy, and the like, including aluminum (Al), molybdenum (Mo), copper (Cu), molybdenum tungsten (MoW), titanium (Ti), and chrome (Cr), for example.

Figure 2:
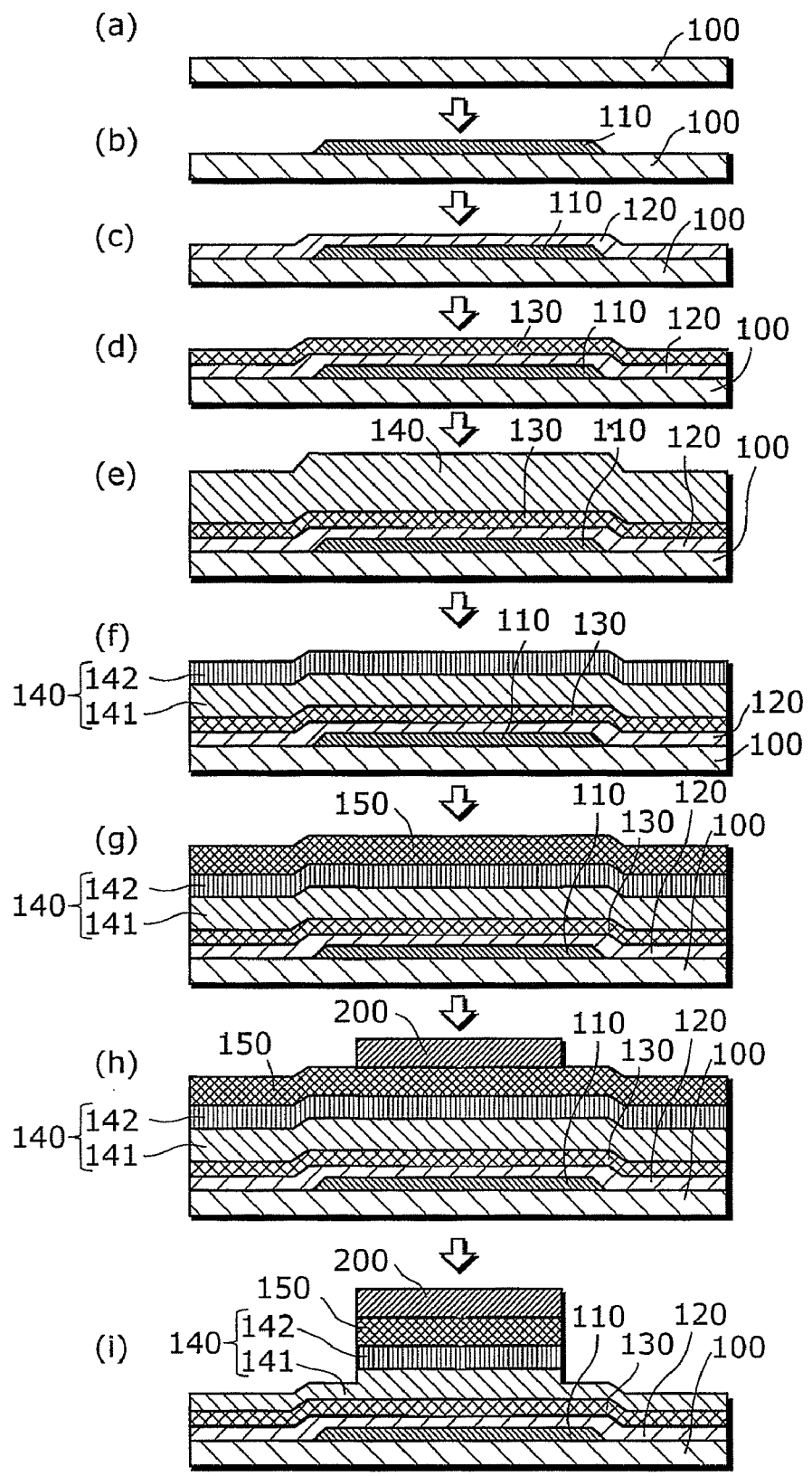
FIG. 2 is a cross-section diagram for schematically explaining a manufacturing method of the thin-film semiconductor device for display apparatus according to the embodiment.
Figure 3:
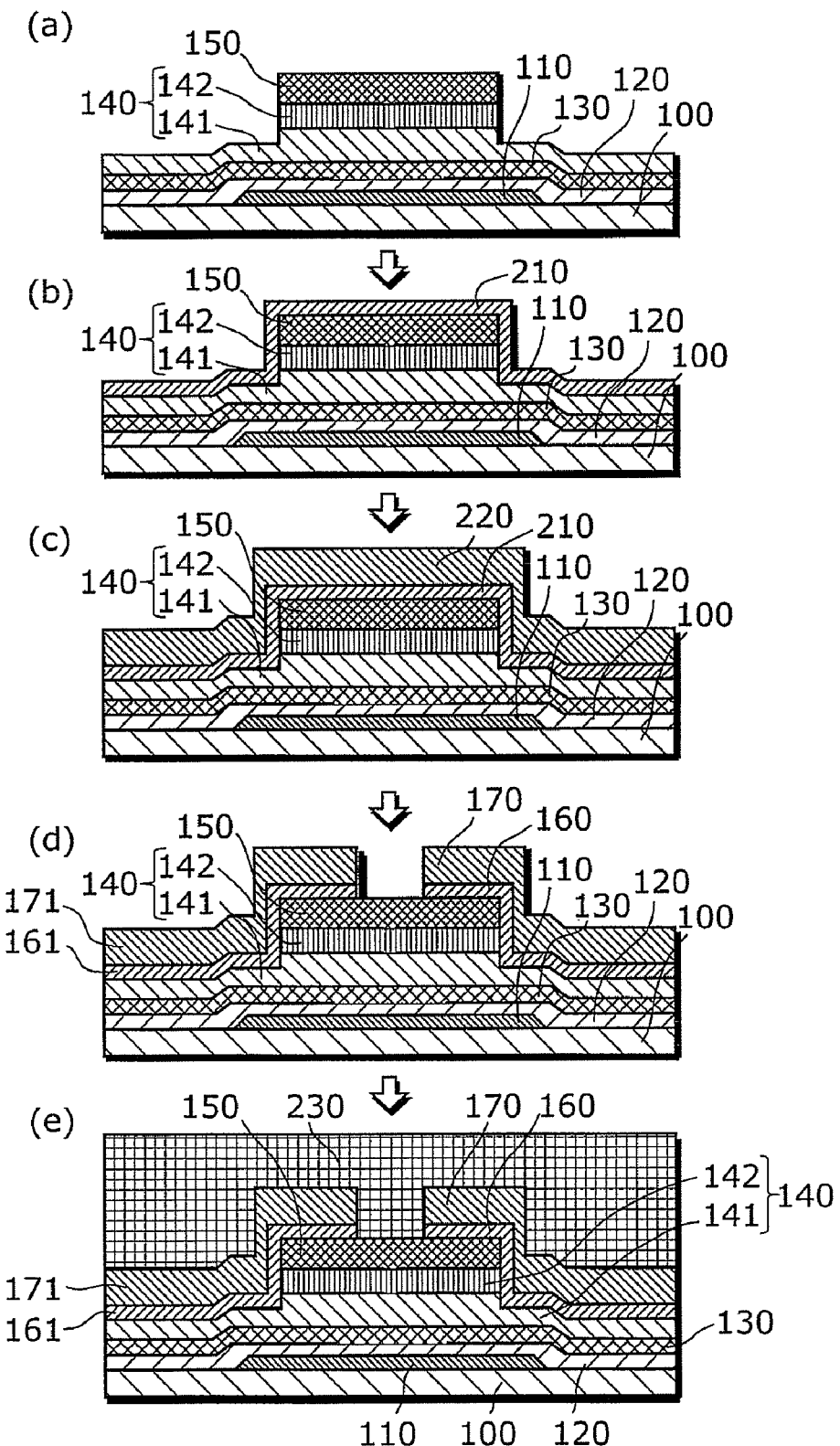
FIG. 3 is a cross-section diagram for schematically explaining a manufacturing method of the thin-film semiconductor device for display apparatus according to the embodiment.

FIGS. 2 and 3 are cross-section diagrams for schematically explaining the manufacturing method of the thin-film semiconductor device for display apparatus according to this embodiment.

First, the substrate 100 is prepared as shown in FIG. 2(a).

Next, the gate electrode 110 is formed on the substrate 100 as shown in FIG. 2(b). For example, a metal film is formed on the substrate 100 by a sputtering process, for example, and then patterned into a desired shape by wet etching using a photoresist mask. The patterned metal film is formed as the gate electrode 110.

Next, the gate insulating film 120 is formed over the gate electrode 110 as shown in FIG. 2(c).

Next, on the gate insulating film 120, the first channel layer 130 made up of a polycrystalline semiconductor layer is formed by a plasma CVD process, for example, as shown in FIG. 2(d).

Next, the second channel layer 140 made up of a non-crystalline semiconductor layer is formed on the first channel layer 130 as shown in FIG. 2(e).

Next, in order to set the upper layer of the second channel layer 140 to be of the second conductivity type, the entire surface in the range of the upper layer of the second channel layer 140 is doped with impurities of the second conductivity type, such as boron (B), as shown in FIG. 2(f). The first layer 141 and the second layer 142 are thus formed.

Next, the insulation layer 150 is formed on the second channel layer 140 as shown in FIG. 2(g).

Next, a resist 200 having a predetermined width is deposited on the insulation layer 150 as shown in FIG. 2(h).

Next, as shown in FIG. 2(i), the insulation layer 150 and the upper layer (the second layer 142) of the second channel layer 140 doped with the impurities are etched together in a predetermined dry etching process using the resist 200 as a mask so that a surface of the second channel layer 140 is formed into a protruding shape (protruding part).

Next, the resist 200 is removed from the insulation layer 150 as shown in FIG. 3(a).

Next, a contact layer 210 of the first conductivity type opposite to the second conductivity type is formed by a plasma CVD process, for example, on the top and lateral surfaces of the insulation layer 150, the lateral surfaces of the protruding part of the second channel layer 140 which continue from the lateral surfaces of the insulation layer 150, and the top surface of the second channel layer 140 which continues from the lateral surfaces of the protruding part of the second channel layer 140, as shown in FIG. 3(b).

Next, a source-drain electrode 220 is formed on the contact layer 210 by a sputtering process, for example, as shown in FIG. 3(c).

Next, as shown in FIG. 3(d), the parts of the contact layer 210 and the source-drain electrode 220 above the protruding part of the second channel layer 140 are etched by predetermined dry etching using a resist as a mask and using the insulation layer 150 as an etching stopper layer. Consequently, on the top and lateral surfaces of the ends of the insulation layer 150, the lateral surfaces of the protruding part of the second channel layer 140 which continue from the lateral surfaces of the insulation layer 150, and the top surface of the second channel layer 140 which continues from the lateral surfaces of the protruding part of the second channel layer 140, the two contact layers 160 and 161 of the first conductivity type opposite to the second conductivity type are formed separately on the both sides of the protruding part of the second channel layer 140. At the same time, the source electrode 170 is formed on the contact layer 160 that is one of the contact layers 160 and 161, and the drain electrode 171 is formed on the contact layer 161 that is the other of the contact layers 160 and 161.

At the end, a passivation film 230 is formed so as to cover the whole thin-film semiconductor device for display apparatus as shown in FIG. 3(e).

According to the thin-film semiconductor device for display apparatus having the above structure, charges move through the first channel layer 130 more easily, which improves on-state characteristics, while the movement of charges through the second channel layer 140 is limited, which improves off-state characteristics. Principles for achieving these effects are described below with reference to FIGS. 4A to 7B.

First, the principle for achieving an effect of increasing on-state current is described.

Figure 4A:
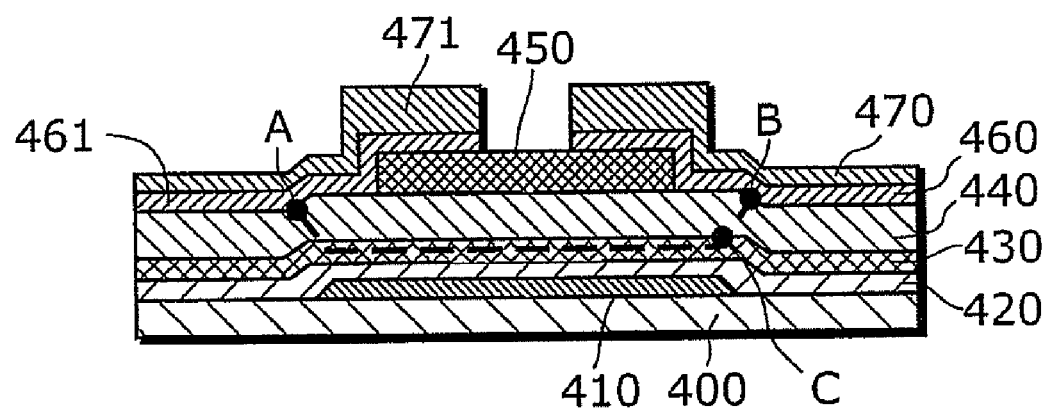
FIG. 4A is a cross-section diagram schematically showing a structure of a common thin-film semiconductor device for display apparatus.
Figure 4B:
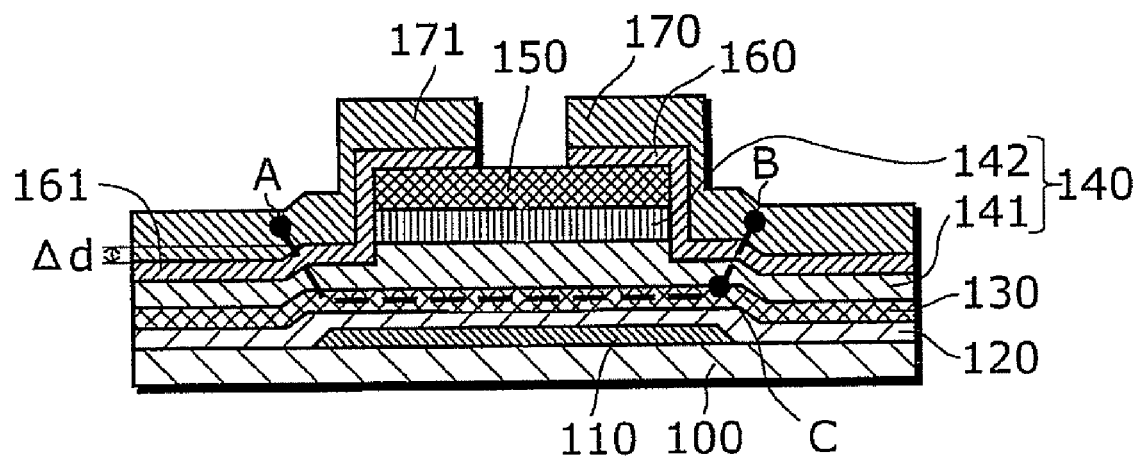
FIG. 4B is a cross-section diagram schematically showing a structure of the thin-film semiconductor device for display apparatus according to the embodiment.
Figure 5A:
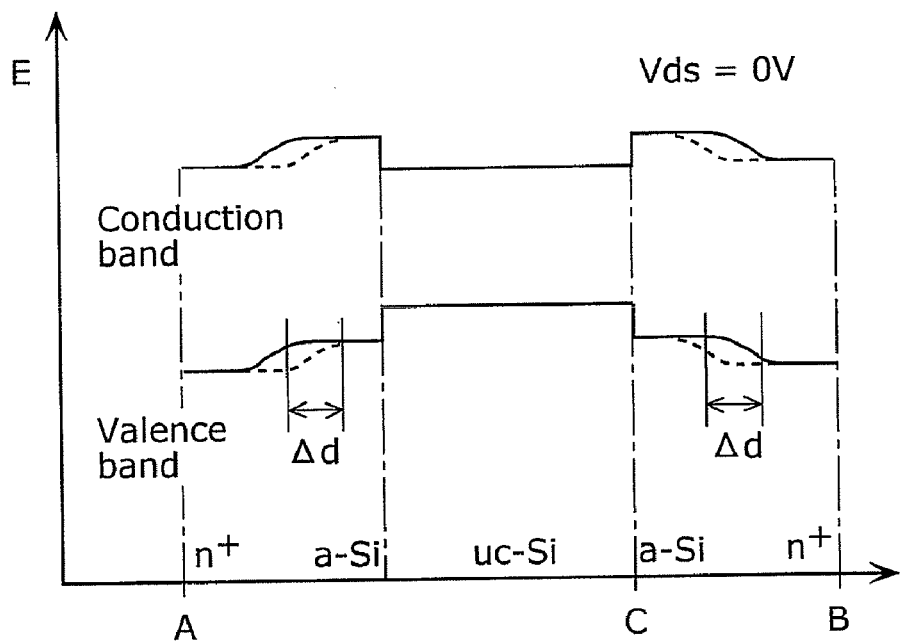
FIG. 5A is a graph showing energy band profiles in broken line A-B of FIG. 4A and in broken line A-B of FIG. 4B when a drain voltage Vds is 0 V.
Figure 5B:
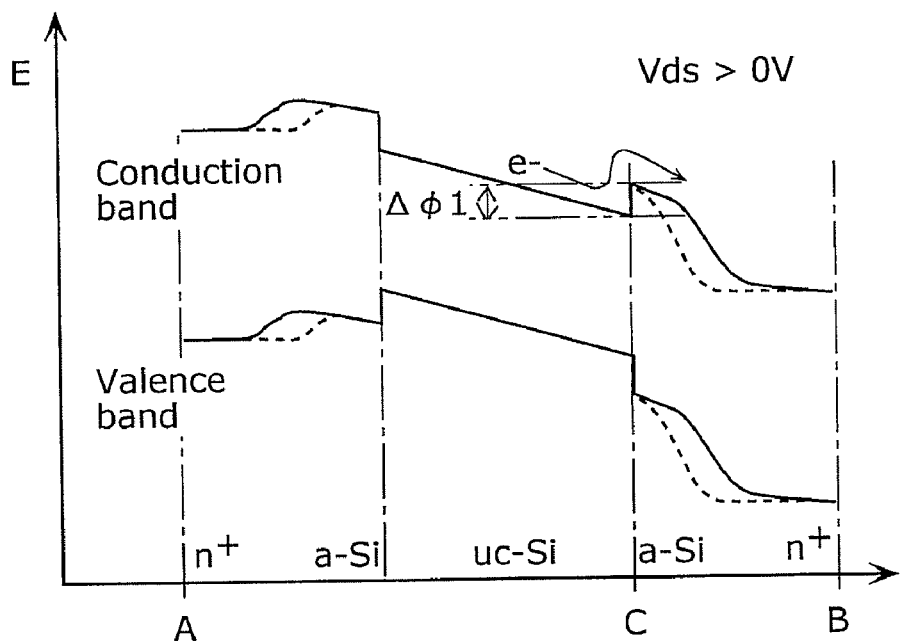
FIG. 5B is a graph showing energy band profiles in broken line A-B of FIG. 4A and in broken line A-B of FIG. 4B when the drain voltage Vds is greater than 0 V.

FIG. 4A shows a cross-section diagram schematically showing a structure of a common thin-film semiconductor device for display apparatus which includes a substrate 400, a gate electrode 410, a gate insulating film 420, a first channel layer 430, a second channel layer 440, an insulation layer 450, a pair of contact layers 460 and 461, and a pair of source electrode 470 and a drain electrode 471. FIG. 4B is a cross-section diagram schematically showing a structure of the thin-film semiconductor device for display apparatus according to the present embodiment of FIG. 1. FIG. 5A shows energy band profiles in broken line A-B of FIG. 4A and in broken line A-B of FIG. 4B (each of which is an energy band profile in a front channel that is one of pathways through which charges move) when a drain voltage Vds is 0 V. FIG. 5B shows energy band profiles in the broken line A-B of FIG. 4A and in the broken line A-B of FIG. 4B (each of which is an energy band profile in a front channel that is one of pathways through which charges move) when the drain voltage Vds is greater than 0 V.

In FIGS. 4A and 4B, it is assumed that the contact layer is an n+non-crystalline silicon layer ($n^+$ layer), the first channel layer is a microcrystalline silicon layer (uc-Si layer), and the second channel layer is a non-crystalline silicon layer (a-Si layer).

In FIGS. 5A and 5B, solid lines indicate the energy band profiles in the broken line A-B of FIG. 4A, and broken lines indicate the energy band profiles in the broken line A-B of FIG. 4B.

Being a non-crystalline layer, the second channel layer has high resistance. However, the second channel layer in FIG. 4B is thinner than the second channel layer in FIG. 4A by thickness $\Delta d$ in the pathway for charges to move, which makes the resistance across the second channel layer of the thin-film semiconductor device FIG. 4B smaller for its thickness of $2 \times \Delta d$ and thus an amount of on-state current flowing therein larger, than those of the thin-film semiconductor device of FIG. 4A. In the case where the second channel layer is thin as shown in FIG. 4B, the application of high voltage Vds more easily induces a decrease in the height of potential barrier 41 at point C, causing carriers to more easily move between the first channel layer and the second channel layer for the decreased height of potential barrier $\Delta \phi 1$, than in the case where the second channel layer is thick. Accordingly, by reducing the thickness of the second channel layer by $\Delta d$, the resistance across the second channel layer can be reduced for its thickness $2 \times \Delta d$, which reduction is greater than a mere reduction in resistance across the second channel layer, with the result that the on-state current can significantly increase.

Next, the principle for achieving an effect of decreasing off-state current is described.

Figure 6A:
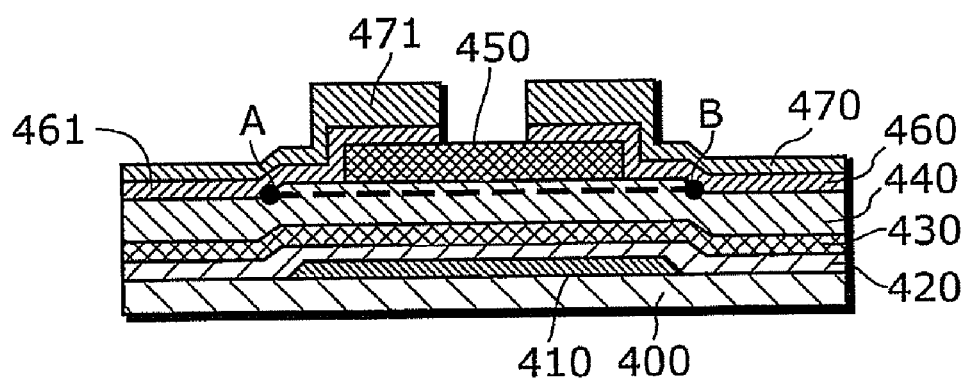
FIG. 6A is a cross-section diagram schematically showing a structure of a common thin-film semiconductor device for display apparatus.
Figure 6B:
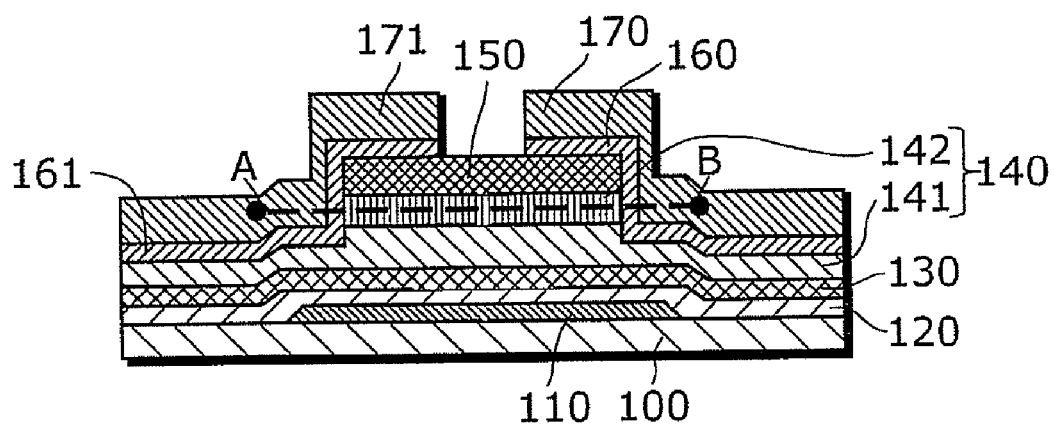
FIG. 6B is a cross-section diagram schematically showing a structure of the thin-film semiconductor device for display apparatus according to the embodiment.
Figure 7A:
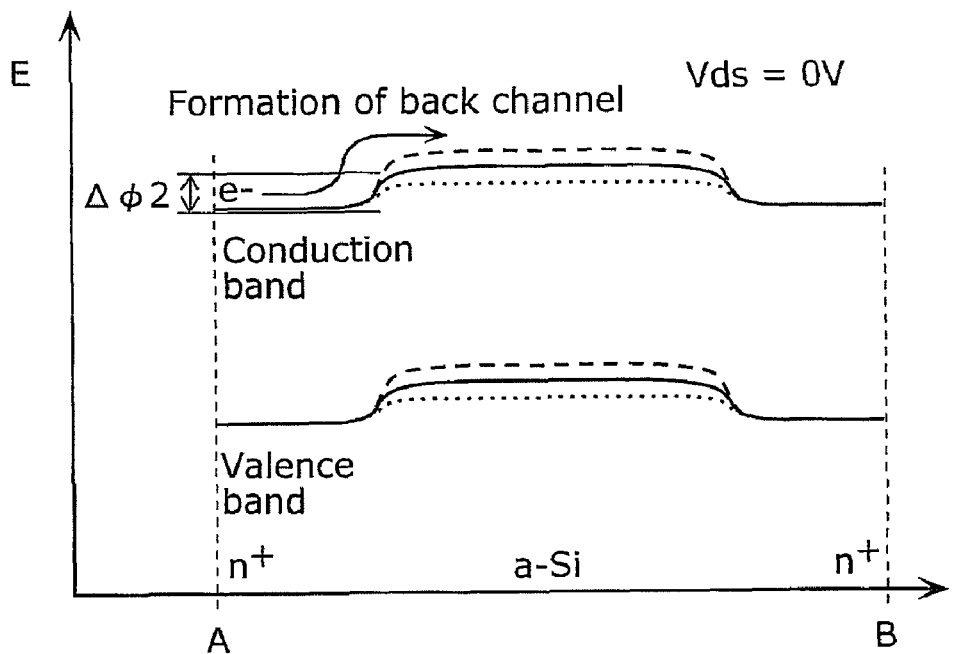
FIG. 7A is a graph showing energy band profiles in broken line A-B of FIG. 6A and in broken line A-B of FIG. 6B when a drain voltage Vds is 0 V.
Figure 7B:
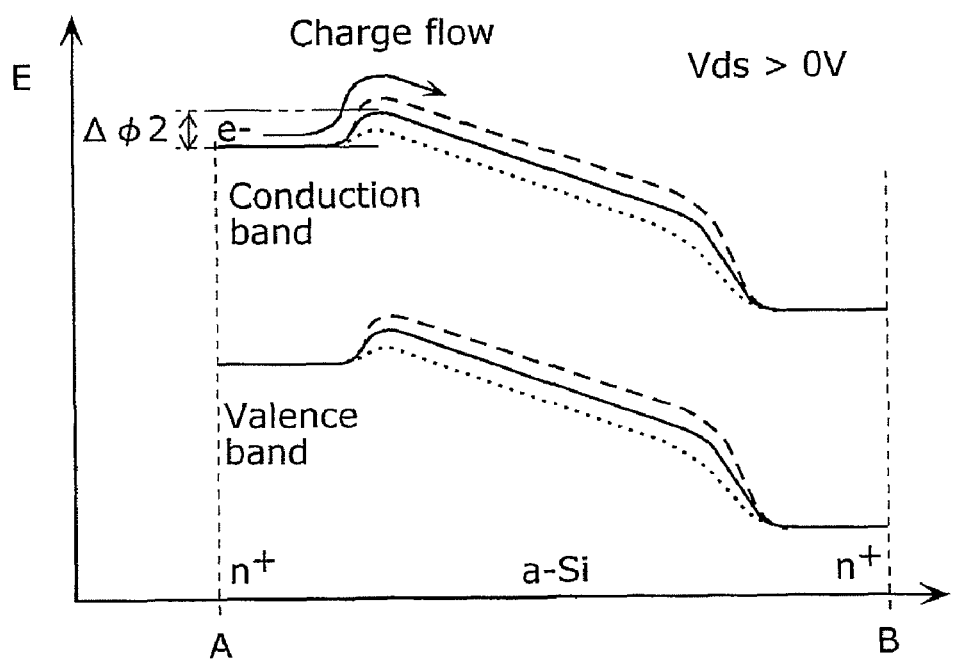
FIG. 7B is a graph showing energy band profiles in broken line A-B of FIG. 6A and in broken line A-B of FIG. 6B when the drain voltage Vds is greater than 0 V.

FIG. 6A is a cross-section diagram schematically showing a structure of a common thin-film semiconductor device for display apparatus of the same kind as that shown in FIG. 4A, and FIG. 6B is a cross-section diagram schematically showing a structure of the thin-film semiconductor device for display apparatus according to the same or like embodiment as in FIG. 4B. FIG. 7A shows energy band profiles in broken line A-B of FIG. 6A and in broken line A-B of FIG. 6B (each of which is an energy band profile in a back channel that is one of pathways through which charges move) when a drain voltage Vds is 0 V. FIG. 7B shows energy band profiles in broken line A-B of FIG. 6A and in broken line A-B of FIG. 6B (each of which is an energy band profile in a back channel that is one of pathways through which charges move) when the drain voltage Vds is greater than 0 V.

In FIGS. 6A and 6B, it is assumed that the contact layer is an $n^+$ non-crystalline silicon layer ($n^+$ layer), the first channel layer is a microcrystalline silicon layer (uc-Si layer), and the second channel layer is a non-crystalline silicon layer (a-Si layer).

In FIGS. 7A and 7B, solid lines indicate the energy band profiles in the broken line A-B of FIG. 6A in the case where the insulation layer has no positive charges, broken lines indicate the energy band profiles in the broken line A-B of FIG. 6B, and dotted lines indicate the energy band profiles in the broken line A-B of FIG. 6A in the case where the insulation layer has positive charges.

Focusing on each of the energy band profiles of FIGS. 7A and 7B (solid line in FIG. 7A), there is a potential barrier $\Delta \phi 2$ between the contact layer and the second channel layer, which prevents formation of a back channel extending from the contact layer to the second channel layer and thereby prevents charges from flowing from the contact layer into the second channel layer. However, in the case where the insulation layer contacting the second channel layer has fixed charges (positive fixed charges in the present embodiment) whose sign corresponds to the conductivity type (P type in the present embodiment) opposite to the conductivity type of the contact layer (N type in the present embodiment), the potential barrier $\Delta\phi2$ is induced to be lowered by application of voltage to the second channel layer because of the presence of the fixed charges, as shown by the energy band profiles of FIGS. 7A and 7B (dotted line in FIG. 7A). As a result, because of the presence of the fixed charges, the voltage applied to the second channel layer exceeds a threshold voltage for formation of a back channel in an interface between the insulation layer and the second channel layer, causing charge conduction in the back channel and thus increasing off-state current as leak current. In contrast, in the case where the upper part of the protruding part of the second channel layer is of a conductivity type (P type in the present embodiment) opposite to the conductivity type of the contact layer as shown in FIG. 6B, the potential barrier $\Delta\phi2$ is high in the upper part of the protruding part of the second channel layer 140 as indicated by broken lines of FIGS. 7A and 7B, and the threshold voltage for formation of a back channel in the interface between the insulation layer and the second channel layer is large, with the result that the voltage attributed to the presence of the fixed charges applied to the second channel can be prevented from exceeding the threshold voltage for formation of a back channel in the interface between the insulation layer and the second channel layer. As a result, it is possible to reduce leak current caused by the charge conduction in the back channel and thereby possible to significantly reduce off-state current.

Figure 8A:
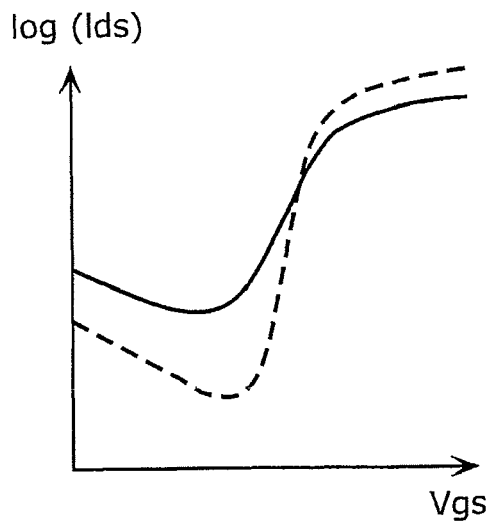
FIG. 8A is a graph showing changes in logarithm of drain current Ids to gate voltage Vgs.
Figure 8B:
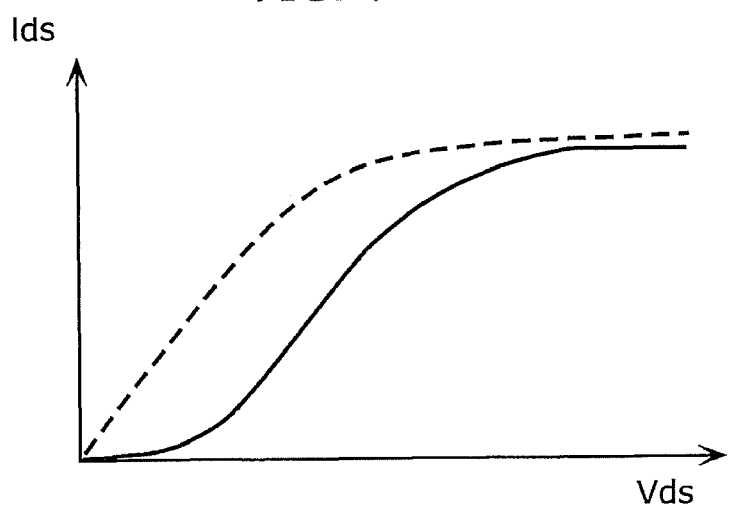
FIG. 8B is a graph showing changes in drain current Ids relative to drain voltage Vds.
Figure 8C:
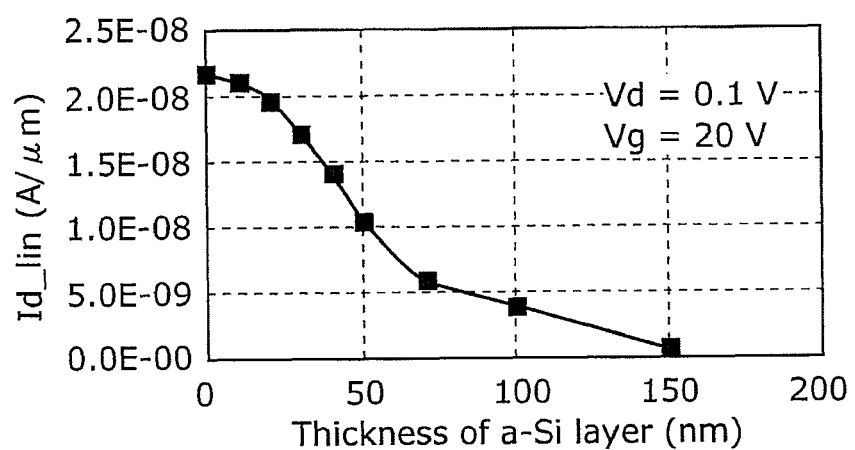
FIG. 8C is a graph showing changes in drain current Ids relative to a thickness of a flat part of the second channel layer.

FIGS. 8A, 8B, and 8C show influences, on current-voltage characteristics, from effects produced by the above thin-film semiconductor device for display apparatus according to the present embodiment.

FIG. 8A is a graph showing changes in logarithm of drain current Ids to gate voltage Vgs and thereby represents transfer characteristics of the thin-film semiconductor device for display apparatus. FIG. 8B is a graph showing changes in drain current Ids relative to drain voltage Vds and thereby represents output characteristics of the thin-film semiconductor device for display apparatus.

In FIGS. 8A and 8B, broken lines indicate characteristics of the thin-film semiconductor device for display apparatus according to the present embodiment shown in FIG. 4B, and solid lines indicate characteristics of the common thin-film semiconductor device for display apparatus shown in FIG. 4A.

Figure 9:
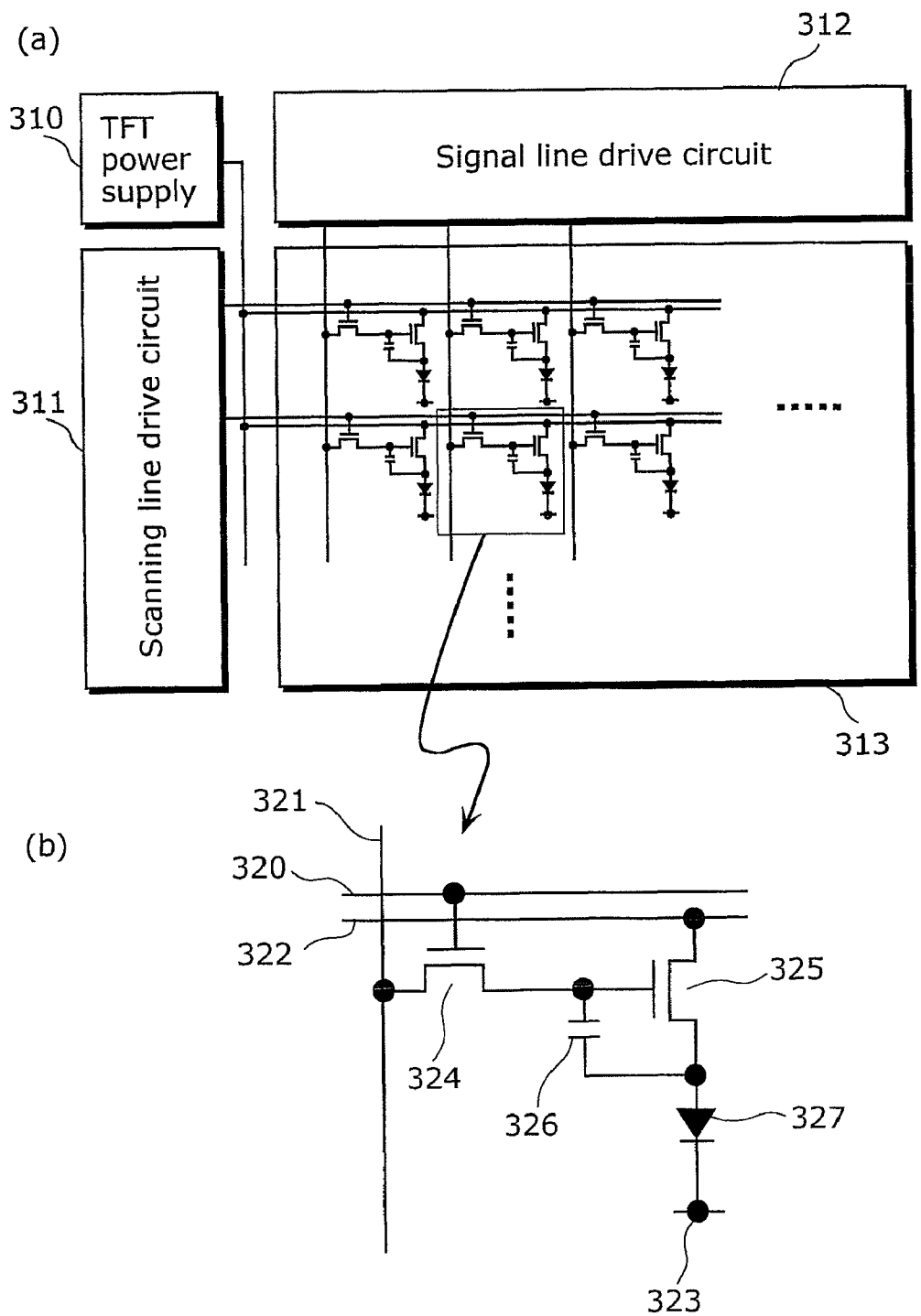
FIG. 9 is a diagram schematically showing a structure of an organic EL display apparatus.

Focusing on FIG. 8A, the top level of on-state current in the thin-film semiconductor device for display apparatus according to the present embodiment is higher than that in the common thin-film semiconductor device for display apparatus. This is good characteristics from the aspect of improvement of power supplying capability of the thin-film semiconductor device for display apparatus, which is demanded along with increasing screen size and increasing resolution of the displays. For example, the thin-film semiconductor device for display apparatus is provided in an organic EL display apparatus (EL display) including a scanning line drive circuit 311, a signal line drive circuit 312, a display unit 313, and a TFT power supply 310 as shown in FIG. 9. Specifically, among a gate line 320, a source line 321, a TFT power line 322, an EL power supply 323, and a thin-film semiconductor device for pixel switch (selection transistor) 324, a thin-film semiconductor device for supplying current to an organic EL element (drive transistor) 325, a load capacitor 326, and an organic EL device 327 which constitute a pixel circuit of the display unit 313, the drive transistor 325 uses the thin-film semiconductor device for display apparatus. In this case, the excellent on-state characteristics of the thin-film semiconductor device for display apparatus allows for a reduction in size of the drive transistor 325, with the result that the EL display is therefore capable of achieving improved yields as well as an improved aperture ratio. In addition, it is capable of achieving reduced power consumption.

Referring to FIG. 8A, the bottom level of off-state current of the thin-film semiconductor device for display apparatus according to the present embodiment is lower than that of the common thin-film semiconductor device for display apparatus. Accordingly, for example, in the case where the thin-film semiconductor device for display apparatus is used for the selection transistor 324 of the EL display of FIG. 9, the excellent off-state characteristics of the thin-film semiconductor device for display apparatus allow prevention of a decrease in contrast attributed to leak current and prevention of uneven image quality in a panel, and it is therefore possible to provide excellent data retention characteristics.

Furthermore, as compared to the common thin-film semiconductor device for display apparatus, the thin-film semiconductor device for display apparatus according to the present embodiment is able to provide an on-off ratio owing to improved characteristics of on-state current and off-state current. Accordingly, for example, in the case where the thin-film semiconductor device for display apparatus is used for the drive transistor 325 of the EL display of FIG. 9, the EL display is able to improve a contrast ratio and thereby improve image quality.

Next, referring to FIG. 8B, the drain current Ids decreases in a range of low drain voltages Vds in the common thin-film semiconductor device for display apparatus while the drain current Ids increases in a range of especially low drain voltages Vds in the thin-film semiconductor device for display apparatus according to the present embodiment. Accordingly, for example, in the case where the thin-film semiconductor device for display apparatus is used for the selection transistor 324 of the EL display of FIG. 9, the EL display is capable of preventing a charge difference between a pixel potential and a data potential during a scanning line selection period.

Next, FIG. 8C shows effects produced by reduction in thickness of the flat parts on the both sides of the protruding part in the second channel layer 140.

FIG. 8C shows changes in drain current Ids relative to a thickness (thickness B in FIG. 1) of the flat part of the second channel layer 140 with drain current Vds of 0.1 V and gate voltage Vgs of 20 V.

FIG. 8C is obtained when the gate insulating film 120 is made of 170 nm-thick $SiO_2$, the first channel layer 130 is made of 30 nm-thick microcrystalline silicon, the protruding part of the second channel layer 140 is made of a 150 nm-thick non-crystalline silicon layer, the insulation layer 150 is made of 150 nm-thick $SiO_2$, and the contact layers 160 and 161 are 25 nm-thick $N^+$ layers.

Referring to FIG. 8C, it is found that the drain current Ids increases as the thickness of the flat part of the second channel layer 140 decreases. Accordingly, in the case where the thin-film semiconductor device for display apparatus is used for the drive transistor 325 of the EL display of FIG. 9, it is preferable to make the flat part of the second channel layer 140 thin in order to improve on-state characteristics.

As above, according to the thin-film semiconductor device for display apparatus in the present embodiment, in the case where the channel layer has a dual-layer structure in which a polycrystalline semiconductor channel layer and a non-crystalline semiconductor channel layer are provided, the on-state current can be significantly increased while the off-state current can be significantly reduced, thus allowing to provide a thin-film semiconductor device having excellent on-off characteristics.

(First Variation)

Figure 10:
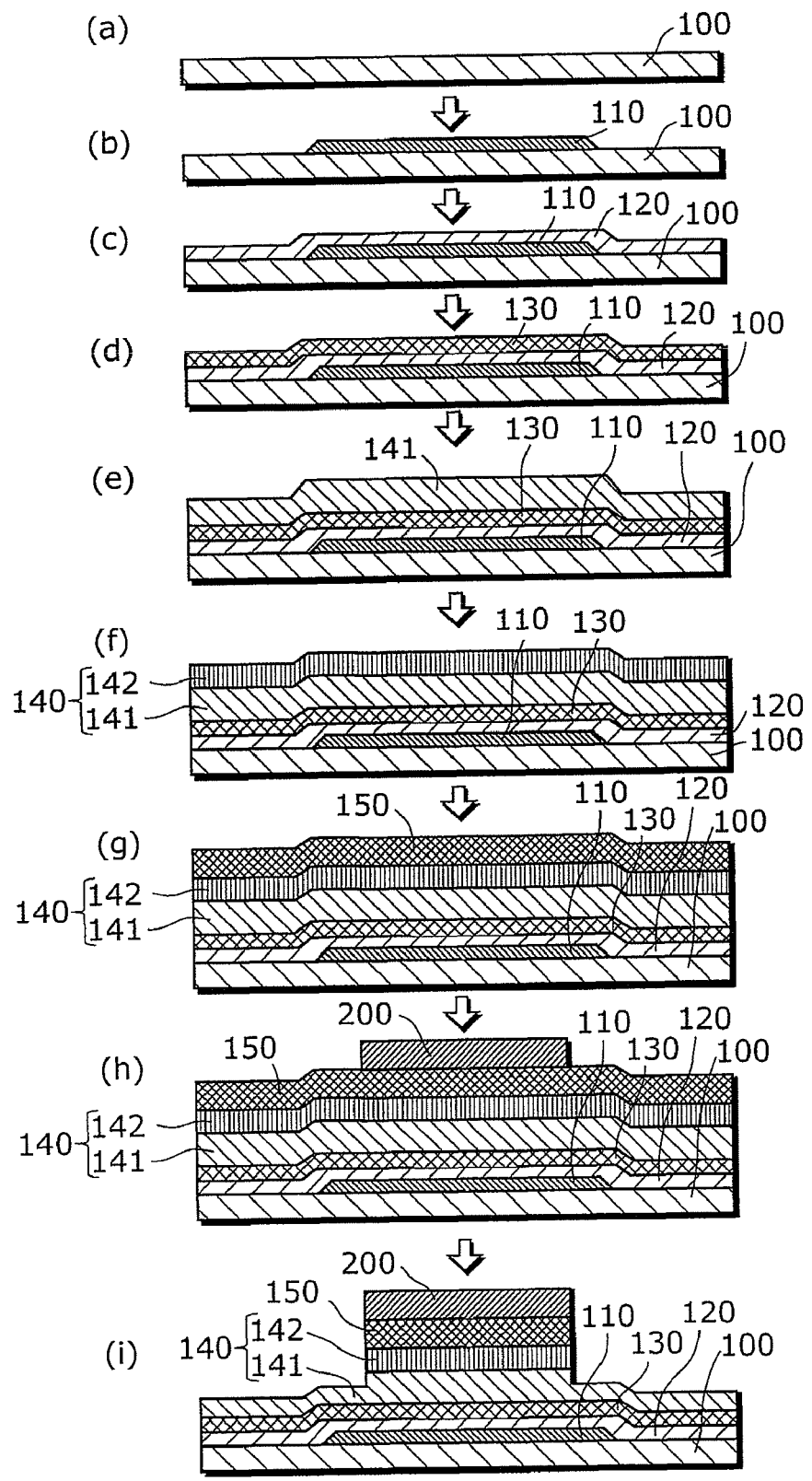
FIG. 10 is a cross-section diagram for schematically explaining the first variation of the manufacturing method of the thin-film semiconductor device for display apparatus according to the embodiment.
Figure 11:
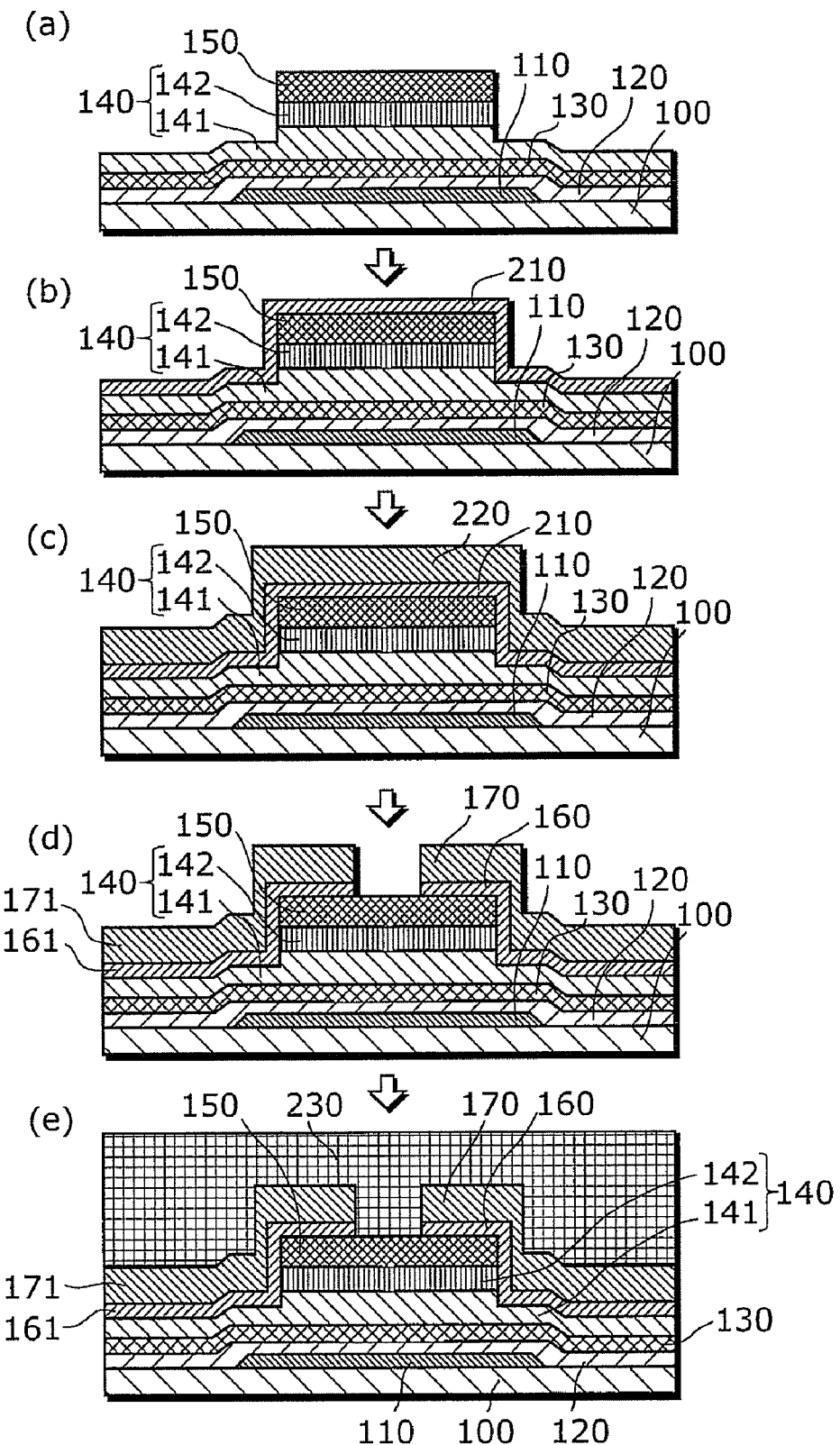
FIG. 11 is a cross-section diagram for schematically explaining the first variation of the manufacturing method of the thin-film semiconductor device for display apparatus according to the embodiment.

FIGS. 10 and 11 are cross-section diagrams for schematically explaining a manufacturing method of a thin-film semiconductor device for display apparatus according to the present variation.

First, the substrate 100 is prepared as shown in FIG. 10(a).

Next, the gate electrode 110 is formed on the substrate 100 as shown in FIG. 10(b). For example, a metal film is formed on the substrate 100 by a sputtering process, for example, and then patterned into a desired shape by wet etching using a photoresist mask. The patterned metal film is formed as the gate electrode 110.

Next, the gate insulating film 120 is formed over the gate electrode 110 as shown in FIG. 10(c).

Next, on the gate insulating film 120, the first channel layer 130 made up of a polycrystalline semiconductor layer is formed using a plasma CVD process, for example, as shown in FIG. 10(d).

Next, the first channel layer 141 made up of a non-crystalline semiconductor layer is formed on the first channel layer 130 as shown in FIG. 10(e).

Next, as shown in FIG. 10(f), the second layer 142 which contains impurities so as to be of the second conductivity type is formed over the entire top surface of the first layer 141, resulting in the second channel layer 140 having the first layer 141 and the second layer 142 which contains impurities so as to be of the second conductivity type.

Next, the insulation layer 150 is formed on the second channel layer 140 as shown in FIG. 10(g).

Next, a resist 200 having a predetermined width is deposited on the insulation layer 150 as shown in FIG. 10(h).

Next, as shown in FIG. 10(i), the insulation layer 150 and the upper layer (the second layer 142) of the second channel layer 140 doped with the impurities are etched together in a predetermined dry etching process using the resist 200 as a mask so that a surface of the second channel layer 140 is formed into a protruding shape (protruding part).

Next, the resist 200 is removed from the insulation layer 150 as shown in FIG. 11(a).

Next, a contact layer 210 of the first conductivity type opposite to the second conductivity type is formed by a plasma CVD process, for example, on the top and lateral surfaces of the insulation layer 150, the lateral surfaces of the protruding part of the second channel layer 140 which continue from the lateral surfaces of the insulation layer 150, and the top surface of the second channel layer 140 which continues from the lateral surfaces of the protruding part of the second channel layer 140, as shown in FIG. 11(b).

Next, a source-drain electrode 220 is formed on the contact layer 210 by a sputtering process, for example, as shown in FIG. 11(c).

Next, as shown in FIG. 11(d), the parts of the contact layer 210 and the source-drain electrode 220 above the protruding part of the second channel layer 140 are etched by predetermined dry etching using a resist as a mask and using the insulation layer 150 as an etching stopper layer. Consequently, on the top and lateral surfaces of the ends of the insulation layer 150, the lateral surfaces of the protruding part of the second channel layer 140 which continue from the lateral surfaces of the insulation layer 150, and the top surface of the second channel layer 140 which continues from the lateral surfaces of the protruding part of the second channel layer 140, the two contact layers 160 and 161 of the first conductivity type opposite to the second conductivity type are formed separately on the both sides of the protruding part of the second channel layer 140. At the same time, the source electrode 170 is formed on the contact layer 160 that is one of the contact layers 160 and 161, and the drain electrode 171 is formed on the contact layer 161 that is the other of the contact layers 160 and 161.

At the end, a passivation film 230 is formed so as to cover the whole thin-film semiconductor device for display apparatus as shown in FIG. 11(e).

(Second Variation)

Figure 12:
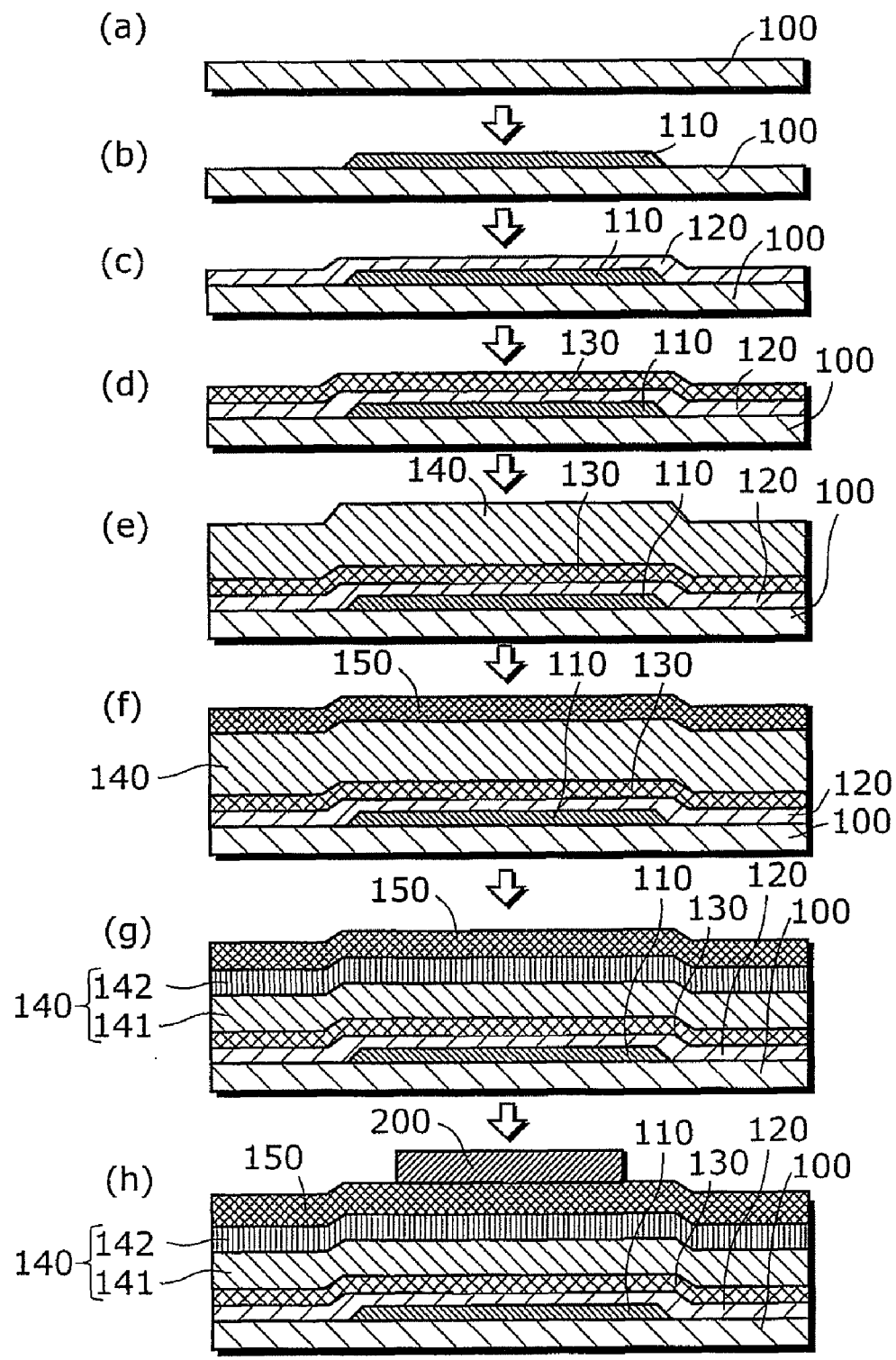
FIG. 12 is a cross-section diagram for schematically explaining the second variation of the manufacturing method of the thin-film semiconductor device for display apparatus according to the embodiment.
Figure 13:
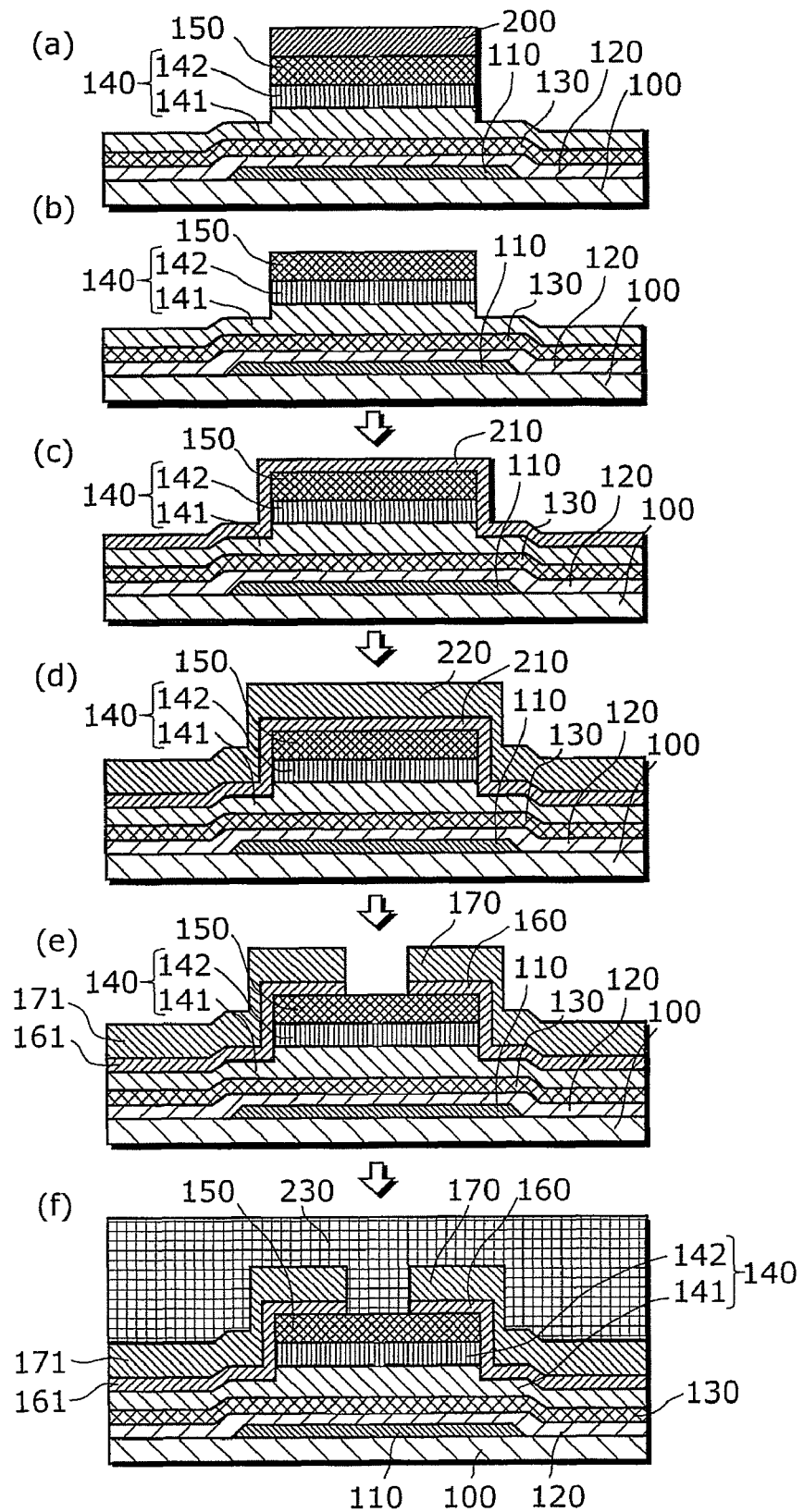
FIG. 13 is a cross-section diagram for schematically explaining the second variation of the manufacturing method of the thin-film semiconductor device for display apparatus according to the embodiment.

FIGS. 12 and 13 are cross-section diagrams for schematically explaining a manufacturing method of a thin-film semiconductor device for display apparatus according to the present variation.

First, the substrate 100 is prepared as shown in FIG. 12(a).

Next, the gate electrode 110 is formed on the substrate 100 as shown in FIG. 12(b). For example, a metal film is formed on the substrate 100 by a sputtering process, for example, and then patterned into a desired shape by wet etching using a photoresist mask. The patterned metal film is formed as the gate electrode 110.

Next, the gate insulating film 120 is formed over the gate electrode 110 as shown in FIG. 12(c).

Next, on the gate insulating film 120, the first channel layer 130 made up of a polycrystalline semiconductor layer is formed using a plasma CVD process, for example, as shown in FIG. 12(d).

Next, the second channel layer 140 made up of a non-crystalline semiconductor layer is formed on the first channel layer 130 as shown in FIG. 12(e).

Next, the insulation layer 150 doped with impurities which impart the second conductivity type to the second channel layer 140 is formed on the second channel layer 140 as shown in FIG. 12(f).

In the case where the second conductivity type is P type and the first conductivity type is N type, the insulation layer 150 contains boron silicate glass (BSG). On the other hand, in the case where the second conductivity type is N type and the first conductivity type is P type, the insulation layer 150 contains phosphorus silicate glass (PSG).

Next, the insulation layer 150 is heated so that the impurities with which the insulation layer 150 is doped are diffused in the upper layer of the second channel layer 140 to form the first layer 141 and the second layer 142 as shown in FIG. 12(g). The heating method includes laser annealing and natural diffusion in formation of the insulation layer 150, for example.

Next, a resist 200 having a predetermined width is deposited on the insulation layer 150 as shown in FIG. 12(h).

Next, as shown in FIG. 13(a), the insulation layer 150 and the upper layer of the second channel layer 140 are etched together in a predetermined dry etching process using the resist 200 as a mask so that a surface of the second channel layer 140 is formed into a protruding shape (protruding part).

Next, the resist 200 is removed from the insulation layer 150 as shown in FIG. 13(b).

Next, a contact layer 210 of the first conductivity type opposite to the second conductivity type is formed by a plasma CVD process, for example, on the top and lateral surfaces of the insulation layer 150, the lateral surfaces of the protruding part of the second channel layer 140 which continue from the lateral surfaces of the insulation layer 150, and the top surface of the second channel layer 140 which continues from the lateral surfaces of the protruding part of the second channel layer 140, as shown in FIG. 13(c).

Next, a source-drain electrode 220 is formed on the contact layer 210 by a sputtering process, for example, as shown in FIG. 13(d).

Next, as shown in FIG. 13(e), the parts of the contact layer 210 and the source-drain electrode 220 above the protruding part of the second channel layer 140 are etched by predetermined dry etching using a resist as a mask and using the insulation layer 150 as an etching stopper layer. Consequently, on the top and lateral surfaces of the ends of the insulation layer 150, the lateral surfaces of the protruding part of the second channel layer 140 which continue from the lateral surfaces of the insulation layer 150, and the top surface of the second channel layer 140 which continues from the lateral surfaces of the protruding part of the second channel layer 140, the two contact layers 160 and 161 of the first conductivity type opposite to the second conductivity type are formed separately on the both sides of the protruding part of the second channel layer 140. At the same time, the source electrode 170 is formed on the contact layer 160 that is one of the contact layers 160 and 161, and the drain electrode 171 is formed on the contact layer 161 that is the other of the contact layers 160 and 161.

At the end, a passivation film 230 is formed so as to cover the whole thin-film semiconductor device for display apparatus as shown in FIG. 13(f).

In the step shown by FIG. 12(g) following the step of forming the insulation layer 150 shown by FIG. 12(f), the insulation layer 150 is heated so that the impurities with which the insulation layer 150 is doped are diffused in the upper layer of the second channel layer 140 to form the second layer 142. However, the step of forming the second layer 142 by diffusing the impurities of the insulation layer 150 in the upper layer of the second channel layer 140 may be performed at any time before formation of the contact layer, and therefore may be performed in any one of the steps from the step shown by FIG. 12(f) to the step of forming the contact layer shown by FIG. 13(c).

While the thin-film semiconductor device for display apparatus and manufacturing method thereof according to an implementation of the present invention has been described above based on the embodiments, the present invention is not limited to these embodiments. The scope of the present invention includes other embodiments in which various modifications that those skilled in the art could think of within the scope of the present invention are made to the present embodiments. In addition, constituents in different embodiments may be combined within the scope of the present invention.

For example, it is needless to say that the first conductivity type and the second conductivity type may be opposite to those described above.

Industrial Applicability

The present invention is applicable to a thin-film semiconductor device for display apparatus and particularly to a liquid crystal display, an organic EL display, or the like.

What is claimed is:

1. A thin-film semiconductor device for a display apparatus, comprising:
    a substrate;
    a gate electrode on said substrate;
    a gate insulating film on said gate electrode;
    a first channel layer including a polycrystalline semiconductor layer on said gate insulating film;
    a second channel layer including a non-crystalline semiconductor layer on said first channel layer, said second channel layer including a protrusion between first top surface end portions of said second channel layer, the protrusion of said second channel layer having first lateral surfaces that each extend between one of the first top surface end portions of said second channel layer and a top surface of the protrusion of said second channel layer;
    an insulation layer on the top surface of the protrusion of said second channel layer, said insulation layer having second lateral surfaces that each extend to one of second top surface end portions of said insulation layer;
    two contact layers, each on one of the second top surface end portions of said insulation layer, adjacent one of the second lateral surfaces of said insulation layer and one of the first lateral surfaces of the protrusion, and on one of the first top surface end portions of said second channel layer;
    a source electrode on one of said two contact layers; and
    a drain electrode on an other of said two contact layers,
    wherein said two contact layers are of a first conductivity type, and
    an upper portion of the protrusion of said second channel layer is of a second conductivity type opposite the first conductivity type.

2. The thin-film semiconductor device according to claim 1,
    wherein charges flow between said first channel layer and one of said source electrode and said drain electrode via a lower portion of said second channel layer that is below the upper portion of the protrusion of said second channel layer.

3. The thin-film semiconductor device according to claim 1, wherein a width of said insulation layer is approximately equal to a width of the top surface of the protrusion of said second channel layer.

4. The thin-film semiconductor device according to claim 1, wherein the upper portion of the protrusion of said second channel layer is doped with impurities to provide the second conductivity type opposite the first conductivity type.

5. The thin-film semiconductor device according to claim 1,
    wherein the first conductivity type is P type, and
    the second conductivity type is N type.

6. The thin-film semiconductor device according to claim 5, wherein said insulation layer comprises phosphorus silicate glass.

7. The thin-film semiconductor device according to claim 1,
    wherein the first conductivity type is N type, and
    the second conductivity type is P type.

8. The thin-film semiconductor device according to claim 7, wherein said insulation layer comprises boron silicate glass.

9. The thin-film semiconductor device according to claim 1,
    wherein the polycrystalline semiconductor layer comprises polycrystalline silicon, and
    the non-crystalline semiconductor layer comprises non-crystalline silicon.

10. The thin-film semiconductor device according to claim 1, wherein the polycrystalline semiconductor layer includes a microcrystalline semiconductor layer having an average particle diameter of at least approximately 20 nm and at most approximately 50 nm.

* * * * *

UNITED STATES PATENT AND TRADEMARK OFFICE
CERTIFICATE OF CORRECTION

PATENT NO.       : 8,330,166 B2
APPLICATION NO.  : 13/115409
DATED            : December 11, 2012
INVENTOR(S)      : Hiroshi Hayashi et al.

It is certified that error appears in the above-identified patent and that said Letters Patent is hereby corrected as shown below:

On the Title page in item [54], and in the Specification, column 1, line 1-3, please change Title, "THIN-FILM SEMICONDUCTOR DEVICE FOR DISPLAY APPARATUS THEREOF AND MANUFACTURING METHOD THEREOF" to --THIN-FILM SEMICONDUCTOR DEVICE FOR DISPLAY APPARATUS AND MANUFACTURING METHOD THEREOF--.

Signed and Sealed this
Eighteenth Day of June, 2013

Teresa Stanek Rea
*Acting Director of the United States Patent and Trademark Office*